United States Patent
Rao et al.

(10) Patent No.: US 7,186,616 B2
(45) Date of Patent: Mar. 6, 2007

(54) METHOD OF REMOVING NANOCLUSTERS IN A SEMICONDUCTOR DEVICE

(75) Inventors: Rajesh A. Rao, Austin, TX (US); Ramachandran Muralidhar, Austin, TX (US); Robert F. Steimle, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/082,094

(22) Filed: Mar. 16, 2005

(65) Prior Publication Data

US 2006/0211199 A1    Sep. 21, 2006

(51) Int. Cl.
    *H01L 21/336* (2006.01)
(52) U.S. Cl. ................ 438/257; 438/197; 257/E21.679
(58) Field of Classification Search ........ 438/257–266; 257/314–325
    See application file for complete search history.

(56) References Cited

U.S. PATENT DOCUMENTS

| | | | |
|---|---|---|---|
| 5,943,571 A * | 8/1999 | Schaefer et al. ............ | 438/257 |
| 6,060,743 A * | 5/2000 | Sugiyama et al. .......... | 257/321 |
| 6,413,819 B1 * | 7/2002 | Zafar et al. ................. | 438/257 |
| 6,896,744 B2 * | 5/2005 | Morinaga et al. ............ | 134/28 |
| 6,958,265 B2 * | 10/2005 | Steimle et al. .............. | 438/211 |
| 2004/0150024 A1 | 8/2004 | Mazoyer et al. | |
| 2005/0014335 A1 | 1/2005 | Goldbach et al. | |

OTHER PUBLICATIONS

Wan, Development of silicon nitride dots for nanocrystal memory cells, Solid-State Electronics 48, 2004, pp.1519-1524.*

Surface Cleaning and Wet Processing Terminology. Arrizona Board of Regents for the University of Arizona. 1999.*

Yingqui et al. GE nanocrystal formed directly by high—dose—ion-implantation and the related UV-VIS photoluminescence. Dec. 1-5, 2003. Abstract.*

Stegemann et al. Microstructure and Electrical Properties of Ge- and Si-Nanoclusters in implanted Gate Oxide for embedded Memory Applications. 2000.*

Kim, Dong-Won; "Charge retention characteristics of SiGe quantum dot flash memories"; Conference Digest, Device Research Conference; 2002; 1 pg. abstract & pp. 151-152; IEEE; USA.

Zhu, Jane G. et al.; "Effects of Ion Beam Mixing on the Formation of SiGe Nanocrystals by Ion Implantation"; Proceedings of the 11th International Conference on Ion Implantation Technology; Jun. 16-21, 1996; 1 pg. abstract & pp. 690-693; IEEE; USA.

* cited by examiner

*Primary Examiner*—Matthew Smith
*Assistant Examiner*—Jarrett J. Stark
(74) *Attorney, Agent, or Firm*—Robert L. King; Daniel D. Hill

(57) ABSTRACT

A method for removing nanoclusters from a semiconductor device includes etching a selected portion of an insulating layer, flowing a reducing gas over the semiconductor device at a temperature in a range of 400–900 degrees Celsius, and flowing a gas comprising halogen over the semiconductor device at a temperature in a range of 400–900 degrees Celsius. In another form, a method for removing the nanoclusters includes implanting germanium or nitrogen into the nanociusters, etching a selected portion of the insulating layer using a dry etch process, and removing the layer of nanoclusters using a wet etch process that is selective to an insulating layer.

14 Claims, 3 Drawing Sheets

METHOD OF REMOVING NANOCLUSTERS IN A SEMICONDUCTOR DEVICE

CROSS REFERENCE TO RELATED APPLICATION

This application is related to copending U.S. application Ser. No. 10/787,510 entitled "Method For Removing Nanoclusters From Selected Regions" by Steimle et al. and assigned to the assignee hereof.

FIELD OF THE INVENTION

This disclosure relates to packaged semiconductors and more particularly to processing of semiconductors having nanoclusters.

RELATED ART

Nanoclusters, including nanocrystals, are structures of a single chemical composition which are typically in the range of one to twenty-five nanometers in diameter. Nanoclusters are used as semiconductor storage elements and as optoelectronic devices for semiconductor applications.

When nanoclusters are embedded into a portion of an integrated circuit, the nanoclusters that are deposited in the periphery region should be removed prior to the formation of peripheral devices such as transistors having gates, sources and drains. During deposition, nanoclusters of different sizes and shapes are formed. Some deposited nanoclusters are much larger than others while others are oblong in shape. The deposition of nanoclusters is not selective across a semiconductor substrate. Therefore, in some areas of an integrated circuit, the nanoclusters must be removed after a blanket deposition. When nanoclusters are deposited on a thin oxide surface, a long wet etch or dry etch is required to remove the nanoclusters from areas where no nanoclusters are desired. The long wet or dry etch compromises the integrity of the semiconductor being manufactured. In particular, the wet etching causes recessing of exposed oxide surfaces. For example, isolation trenches are commonly formed to electrically separate transistors. These isolation trenches are filled with oxide that becomes recessed as a result of any wet etch chemistry that might be used to remove adjacent nanoclusters. Also, when conventional dry etch chemistries are applied to remove nanoclusters, all exposed silicon surfaces are consumed resulting in either roughened surfaces or recessed regions. Because nanoclusters are realistically not all uniform spheres, the removal of the nanoclusters using conventional etching techniques is not consistent. As a result, those nanoclusters which are larger or which have oblong shapes may remain on a surface.

BRIEF DESCRIPTION OF THE DRAWINGS

The present invention is illustrated by way of example and not by limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
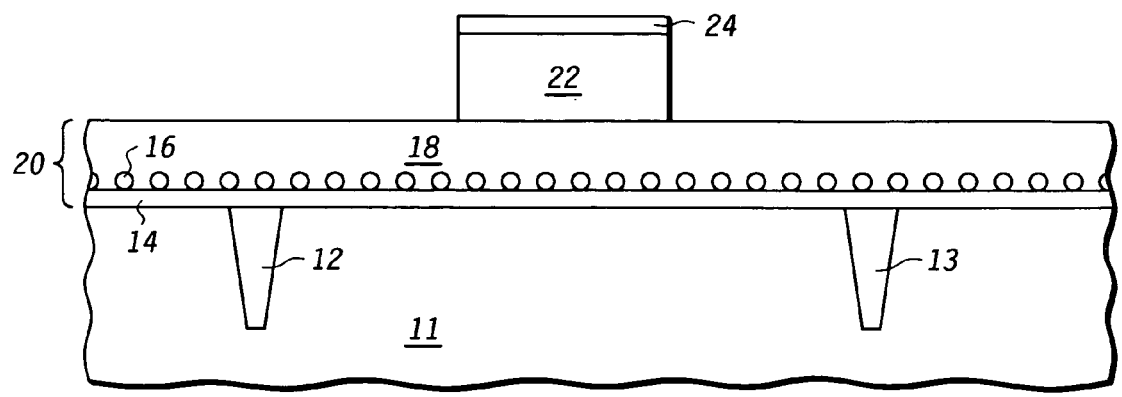
FIGS. 1–5 illustrate in cross-sectional form a method for removing nanoclusters from a desired portion of a semiconductor in accordance with one form of the present invention.

Illustrated in FIG. 1 is a portion of a semiconductor device 10 in accordance with one form of the present invention. The semiconductor device 10 has a substrate 11, a first isolation trench 12 and a second isolation trench 13 formed therein. In one form, the substrate 11 is single crystal silicon. However, other materials may be used such as gallium arsenide, silicon on insulator (SOI), etc. The isolation trenches may contain any of numerous insulating materials. For example, isolation trenches 12 and 13 may contain silicon dioxide, nitride, high k dielectric materials, etc. In the illustrated form each of the isolation trenches contain a same dielectric material. However, different dielectric materials may be present in different isolation trenches. It should be well understood that an integrated circuit has scores of such isolation trenches for electrical device separation.

Overlying the substrate 11 and the isolation trenches 12 and 13 is a first insulating layer or a first dielectric layer 14. The first dielectric layer 14 is silicon dioxide. In one form the first dielectric layer 14 is thermally grown overlying the substrate 11 and the isolation trenches 12 and 13. However, the first dielectric layer 14 may be formed by other techniques including formation by deposition. Overlying the first dielectric layer 14 is a plurality of nanoclusters 16. Nanoclusters are, in the illustrated form, silicon nanoclusters. It should be understood that nanoclusters having silicon content with other materials may also be used. In one form the nanoclusters 16 are formed by chemical vapor deposition (CVD). However, nanoclusters 16 may also be formed by other techniques including aerosol deposition or ion implantation. Overlying and surrounding the plurality of nanoclusters 16 is a second insulating layer or a control dielectric layer 18. The control dielectric layer 18 is, in one form, silicon dioxide. Other dielectric materials may however be used such as nitrides, high k dielectric materials and composite layers of oxides and the above. In one form the control dielectric layer 18 is deposited. However, it should be appreciated that other formation techniques may be used including thermal growth so that the first dielectric layer 14 and the control dielectric layer 18 are a same dielectric layer and the nanoclusters 16 are formed by ion implantation. At this point a nonvolatile memory (NVM) stack 20 exists in the form of the first dielectric layer 14, the plurality of nanoclusters 16 and the control dielectric layer 18. In the illustrated form of FIG. 1 a control electrode or gate electrode 22 is patterned to overlie the control dielectric layer 18 between isolation trench 12 and isolation trench 13. The patterning is accomplished by the formation of a dielectric cap 24 over the desired remaining portion of the gate electrode 22 and then etching the gate electrode 22 with a conventional anisotropic dry etch.

Figure 2:
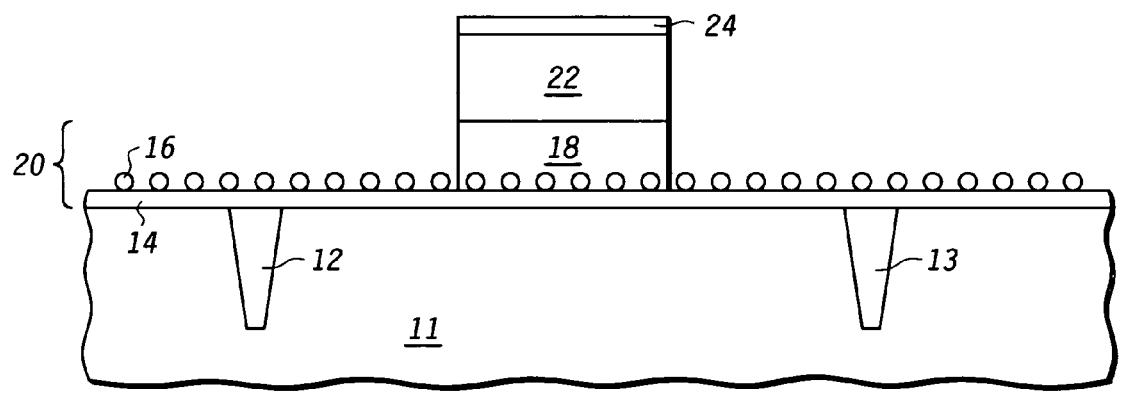

Illustrated in FIG. 2 is further processing of semiconductor device 10. An anisotropic dry etch (e.g. a reactive ion etch (RIE)) is performed to remove all exposed portions of the control dielectric layer 18. The dielectric cap 24 functions as a masking layer to protect the underlying gate electrode 22 and NVM stack 20 having control dielectric layer 18, nanoclusters 16 and the first dielectric layer 14. The anisotropic dry etch functions to substantially remove the control dielectric layer 18 but it should be understood that some residual dielectric material (not shown) may exist between the nanoclusters 16 and/or on top of the nanoclusters 16. The anisotropic dry etch is not endpointed but rather is a timed etch. In another form, a wet etch may be performed rather than a dry etch. Potentially there will be undercutting of the NVM stack 20 with a wet etch since the wet etch is isotropic.

Figure 3:
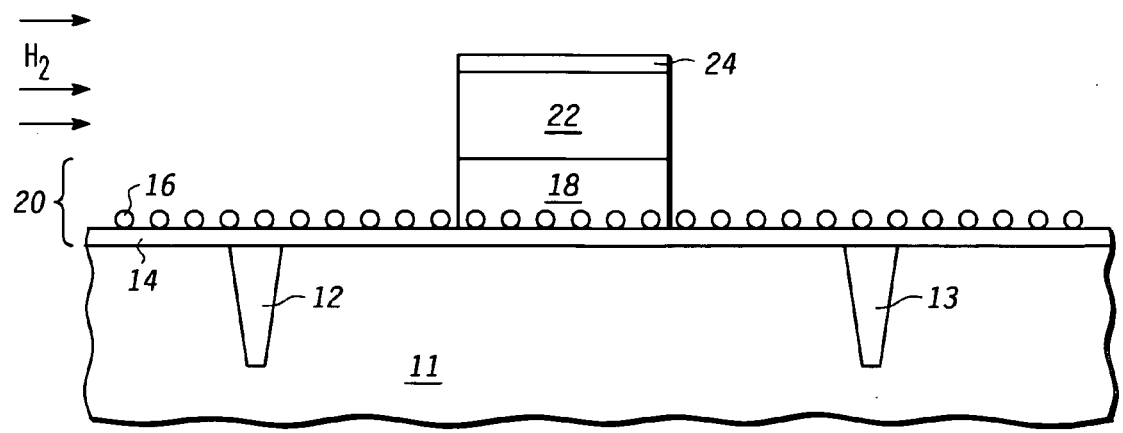

Illustrated in FIG. 3 is further processing of semiconductor device 10. In the illustrated form semiconductor device 10 is exposed to a flow of hydrogen ($H_2$) gas at a temperature between approximately four hundred degrees Celsius and nine hundred degrees Celsius. The hydrogen gas functions to reduce any oxide contained on the surface of the nanoclusters 16. In other words, the hydrogen gas removes all oxygen in the form of oxide bonds that are present on the surface of the nanoclusters 16. As will be seen below, the removal of the surface oxygen from the nanoclusters 16 that are silicon based provides a significant advantage in being able to readily remove all of the nanoclusters. It could be any other reducing gas and is not limited to hydrogen. Other reducing gases include, for example, carbon monoxide and other hydrocarbons. The flow of the hydrogen reducing gas is timed so that the NVM stack 20 is not significantly laterally etched because the purpose is to expose the silicon of the nanoclusters 16. This purpose can be readily achieved without degrading the structure of the NVM stack 20. For example, flowing the hydrogen for approximately one minute or less will expose silicon on most of the surfaces of the nanoclusters 16 without significantly etching the NVM stack 20. Although in the illustrated form directionality of the hydrogen reducing gas is implied, there is no requirement that the gas flow be directional.

Figure 4:
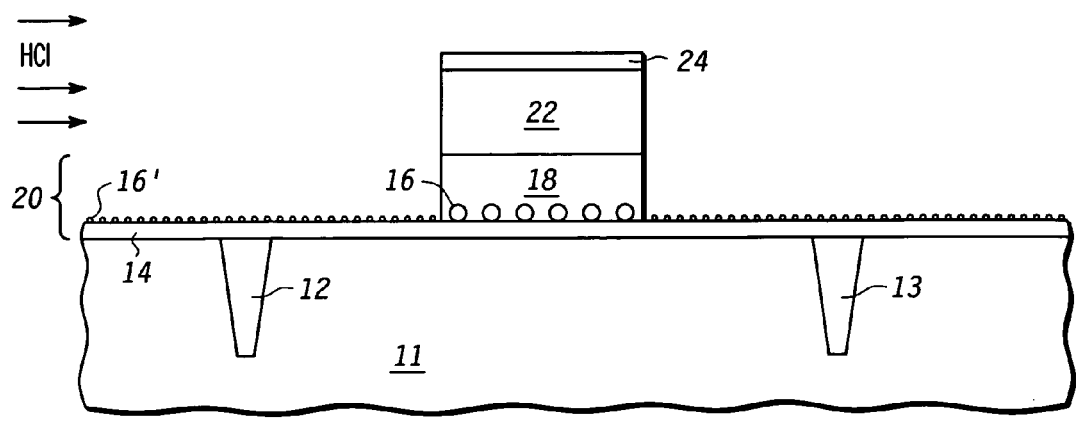

Illustrated in FIG. 4 is further processing of semiconductor device 10 in accordance with the present invention. In the illustrated form, flow of the hydrogen reducing gas is terminated and a flow of hydrogen chloride (HCl) is begun in a same chamber without breaking a vacuum associated with the processing flow. As a result the nanoclusters 16 are not exposed to oxygen. The hydrogen chloride is flowed for a short duration at temperatures somewhere from approximately four hundred degrees Celsius to nine hundred degrees Celsius. In one form the HCl is flowed for less than one minute in order to avoid etching exposed sides of the gate electrode 22 which is typically polysilicon. Optionally, an oxide sidewall spacer (not shown) may first be formed around gate electrode 22 prior to flowing the $H_2$ and HCl gases. The chlorine in the HCl gas functions to react with silicon and remove all of the exposed nanoclusters 16 while not reacting with the underlying first dielectric layer 14 which is typically an oxide. By first exposing silicon at the surface of the silicon nanoclusters 16, the use of a gaseous element such as chlorine may be used to consume the nanoclusters 16 without significantly degrading the chemistry or the shape of the underlying supporting layer which in this example is the first dielectric layer 14. The first dielectric layer 14 functions during this portion of the processing to protect the underlying silicon substrate 11 from the gas containing halogen being used to remove the nanoclusters 16'. It should be well understood that the reaction gases and volatile byproducts such as $SiCl_4$ are pumped from a chamber (not shown) containing semiconductor device 10 and are not deposited elsewhere on semiconductor device 10 to further modify semiconductor device 10. In the illustrated form of FIG. 4, the nanoclusters 16' are illustrated in significantly reduced size prior to being completely consumed by the HCl. Other removal gases may be used. For example, any gas that has halogen may be used to remove the nanoclusters 16. By way of example only, such halogen containing gases are fluorine ($F_2$) or hydrogen bromide (HBr). As with FIG. 3, no directionality of the flow of the gas is required. The temperatures at which these two gas flows are performed are sufficiently low for semiconductor processing so that no negative consequences result in the device.

Figure 5:
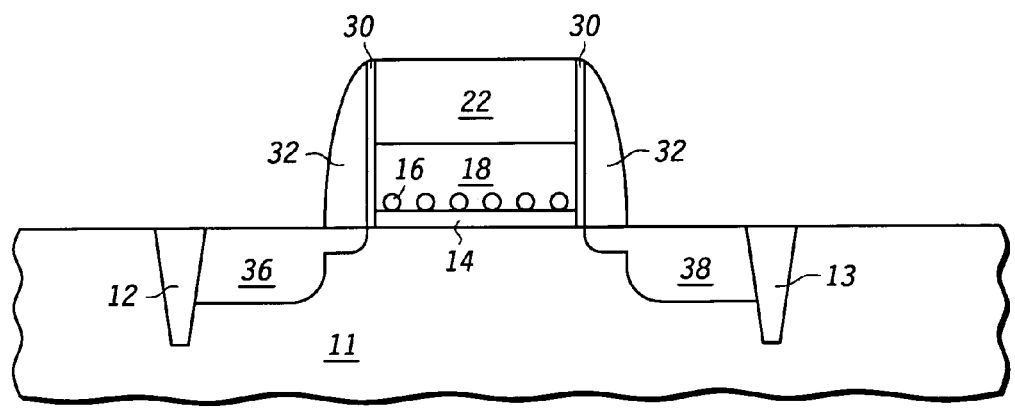

Illustrated in FIG. 5 is further processing of semiconductor device 10 to form a completed operating transistor capable of functioning as a nonvolatile memory (NVM) cell. As a first component of the processing, remaining portions of the first dielectric layer 14 are removed by a wet etch. In the illustrated form, sidewall liner 30 is formed by a blanket deposition of a dielectric and an anisotropic etch of the dielectric to leave the illustrated sidewall liner 30. A first portion of source 36 and drain 38 extensions are implanted immediately adjacent the sidewall liner 30 and within the substrate 11 to the respective isolation trenches 12 and 13. A conventional sidewall spacer 32 is formed adjacent the sidewall liner 30 on each side of the gate electrode 22. A typical material used for the sidewall spacer is a nitride. It should be understood that sidewall spacer 32 surrounds the gate electrode 22. During the formation of the sidewall spacer 32, the dielectric cap 24 is removed if it has not already been removed prior to the formation of sidewall liner 30. A second and stronger implant of source 36 and drain 38 is made to create a deeper source and a deeper drain, respectively. Conventional contacts (not shown) to the source, drain and gate of semiconductor device 10 may be readily formed. It should be apparent that there has been provided a method for efficiently and effectively removing silicon nanoclusters to form an NVM memory cell transistor. Other types of devices may be formed using the methods taught herein. For example, various optoelectronic devices may be formed using the methods described herein.

Figure 6:
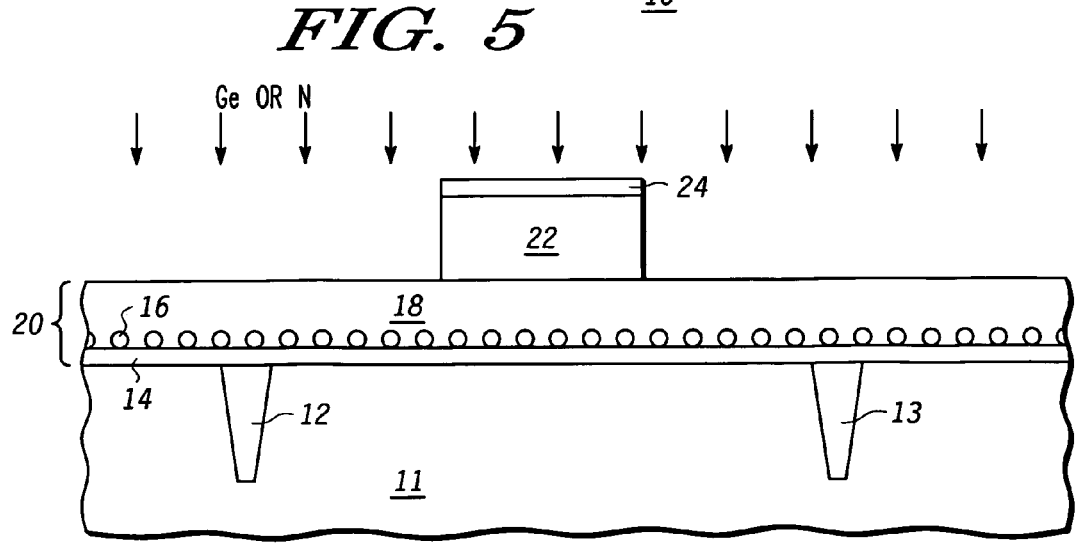
FIGS. 6–9 illustrate in cross-sectional form another form of a method for removing nanoclusters from a desired portion of a semiconductor.

Illustrated in FIG. 6 is a semiconductor device 10' formed using another form of the present invention. For convenience of illustration and explanation, structural elements illustrated in FIGS. 6–9 that are analogous to those illustrated in FIGS. 1–5 will be numbered the same. Similarly, redundancy of common steps used in the method of FIGS. 6–9 and FIGS. 1–5 will be avoided. The structure of semiconductor device 10' of FIG. 6 is formed substantially as illustrated in FIG. 1. The control dielectric layer 18 of the NVM stack 20 is exposed to a germanium implantation as illustrated in FIG. 6. In one form germanium is implanted at a dose within a range of $10^{15}$ to $5\times10^{16}$ atoms per centimeter squared ($cm^2$) and at an ion energy within a range of 2 to 15 keV. This implant dosage corresponds to a germanium content of the nanoclusters in the range of two to fifty percent. The germanium is driven into and through the control dielectric layer 18 and reaches the nanoclusters 16. When the germanium reaches the nanoclusters 16, the germanium is driven into the nanoclusters 16 which previously was silicon with an oxide outer shell. In other words, the silicon nanoclusters 16 now form germanium-containing silicon nanoclusters 16". It should be understood that some amount of germanium is also implanted into the first dielectric layer 14. In the illustrated form, the portion of control dielectric layer 18 that is covered by and underlying the gate electrode 22 and the dielectric cap 24 is not exposed directly to the germanium implantation. All other portions of the control dielectric layer 18 will contain both oxide and germanium. An optional anneal step may also be implemented following the implantation of germanium. In one form, the anneal is performed in a range of approximately 900 degrees Celsius and 1100 degrees Celsius for less than one minute. The anneal functions to make the nanoclusters 16 crystalline again after the germanium implant which may make the nanoclusters amorphous. In another form, other elements may be implanted into semiconductor device 10' rather than germanium. For example, nitrogen may be implanted into the nanoclusters 16 to form silicon nitride nanoclusters 16". The nitrogen implant in one form is at an energy within a range of one to six kilo electron Volts with a dose within a range of $5 \times 10^{15}$ to $5 \times 10^{16}$ atoms per $cm^2$. This implant dosage corresponds to a nitrogen content in the nanoclusters in the range of five to fifty percent.

Figure 7:
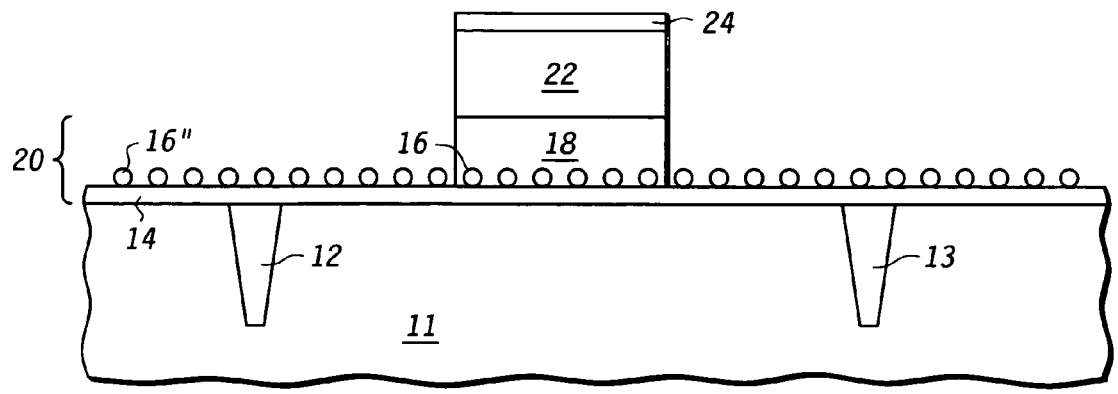

Illustrated in FIG. 7 is further processing of semiconductor device 10' wherein the control dielectric layer 18 is removed by an anisotropic dry etch to expose nanoclusters 16" which have some germanium content. By way of example only a reactive ion etch (RIE) is performed to remove all exposed portions of the control dielectric layer 18. The dielectric cap 24 functions as a masking layer to protect the underlying gate electrode 22 and NVM stack 20 having control dielectric layer 18, nanoclusters 16 and the first dielectric layer 14. The anisotropic dry etch functions to substantially remove the control dielectric layer 18 but it should be understood that some residual dielectric material (not shown) may exist between the nanoclusters 16" and/or on top of the nanoclusters 16". The anisotropic dry etch is not endpointed but rather is a timed etch. In another form, a wet etch may be performed rather than a dry etch. Potentially there will be undercutting of the NVM stack 20 with a wet etch since the wet etch is isotropic. It should be understood that the processing illustrated in FIGS. 6 and 7 may be reversed. In other words, the control dielectric layer 18 that is removed in FIG. 7 may be removed before the germanium implant of FIG. 6. The end structure and material content as illustrated in FIG. 7 results in either order to begin the processing illustrated in FIG. 8.

Figure 8:
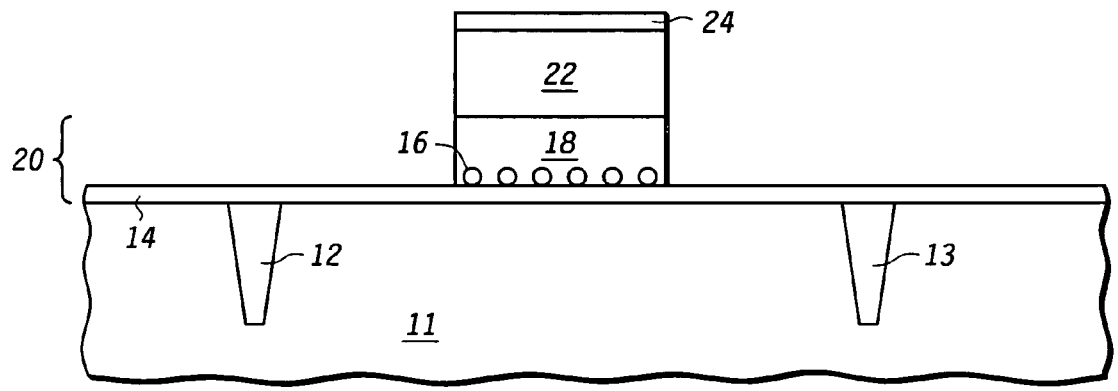

Illustrated in FIG. 8 is further processing of semiconductor device 10' wherein the nanoclusters 16" are removed using a conventional isotropic wet etch. If the nanoclusters 16" are silicon germanium in content, an RCA clean is implemented. In one form the RCA clean is a two step process wherein the first step involves exposure to a mixture containing ammonia hydroxide, hydrogen peroxide and water. The second step involves exposure to a mixture containing hydrochloric acid, hydrogen peroxide and water. The RCA clean removes the germanium containing silicon nanoclusters 16" selective to the underlying first dielectric layer 14. The RCA clean typically occurs at room temperature. If the nanoclusters 16" have a silicon nitride content, a hot phosphoric acid etch is used to remove the nanoclusters 16" selective to the underlying first dielectric layer 14.

Figure 9:
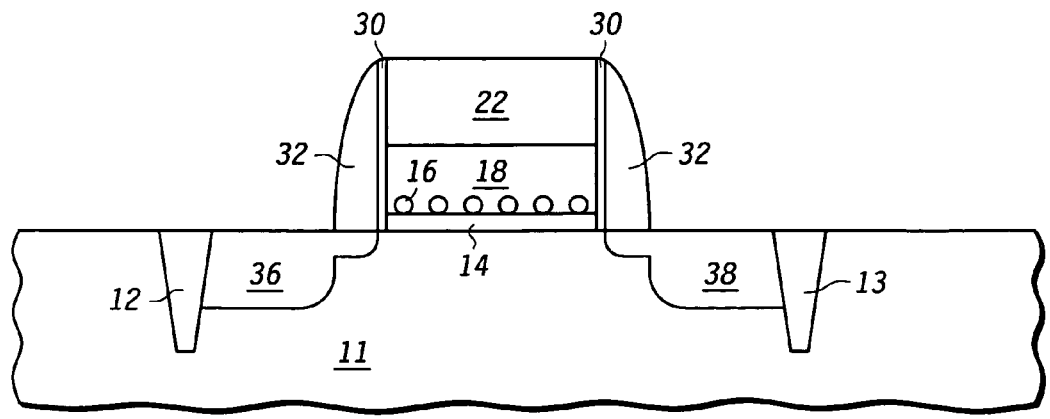

Illustrated in FIG. 9 is further processing of semiconductor device 10' to form a completed operating transistor capable of functioning as a nonvolatile memory (NVM) cell. As a first component of the processing, remaining portions of the first dielectric layer 14 is removed by a wet etch. In the illustrated form, sidewall liner 30 is formed by a blanket deposition of a dielectric and an anisotropic etch of the dielectric to leave the illustrated sidewall liner 30. A first portion of source 36 and drain 38 extensions are implanted immediately adjacent the sidewall liner 30 and within the substrate 11 to the respective isolation trenches 12 and 13. A conventional sidewall spacer 32 is formed adjacent the sidewall liner 30 on each side of the gate electrode 22. A typical material used for the sidewall spacer is a nitride. It should be understood that sidewall spacer 32 surrounds the gate electrode 22. During the formation of the sidewall spacer 32, the dielectric cap 24 is removed if it has not already been removed prior to the formation of sidewall liner 30. A second and stronger implant of source 36 and drain 38 is made to create a deeper source and a deeper drain, respectively. Conventional contacts (not shown) to the source, drain and gate of semiconductor device 10 may be readily formed. It should be apparent that there has been provided a method for efficiently and effectively removing silicon nanoclusters to form an NVM memory cell transistor. Other types of devices may be formed using the methods taught herein. For example, various optoelectronic devices may be formed using the methods described herein.

By now it should be appreciated that there has been provided a method for removing nanoclusters and for efficiently integrating circuitry that does not use nanoclusters with circuitry that does use nanoclusters. Deposition of nanoclusters does not readily lend itself to conventional masking techniques. For example, if a photoresist mask is used and blanket deposition of nanoclusters is implemented, the integrity of the photoresist mask will not survive the nanocluster deposition process. For example, temperatures at which the nanocluster deposition occurs are typically high enough that photoresist masks are not viable. Furthermore, when nanoclusters are deposited on a thin oxide surface, a long wet etch or dry etch is typically required to remove nanoclusters substantially larger than the mean size. Such a conventional long wet or dry etch may compromise the integrity of devices built on the periphery. Therefore, the methods provided herein provide a practical and efficient selective nanocluster deposition process. The methods provided herein will reduce topography at the silicon surface and minimize the time length and intensity required for wet cleans commonly implemented after etching.

In one form there has been provided a method in which a semiconductor substrate is provided and a first insulating layer is formed over a surface of the semiconductor substrate. A layer of nanoclusters is formed over a surface of the first insulating layer. A second insulating layer is formed over the layer of nanoclusters. A selected portion of the second insulating layer is etched. A reducing gas is flowed over the semiconductor device. The semiconductor substrate is at a temperature in a range of 400–900 degrees Celsius. A gas containing halogen is flowed over the semiconductor device, the semiconductor substrate being at a temperature in a range of 400–900 degrees Celsius. In one form a selected portion of the second insulating layer being etched is etched using a dry etch process. In one form the reducing gas is flowed by flowing a gas comprising hydrogen. In another form the flowing of the gas containing halogen further includes flowing a gas having hydrogen chloride. In another form the nanoclusters of the layer of nanoclusters are silicon nanoclusters. In yet another form a control electrode is formed over the second insulating layer prior to etching a selected portion thereof. In another form source/drain extensions are implanted in the semiconductor substrate. In yet another form the first insulating layer is formed by forming the first insulating layer from an oxide comprising silicon. In yet another form flowing the gas containing halogen directly follows flowing the reducing gas without exposing the nanoclusters to oxygen.

In another form a method is provided wherein a semiconductor substrate is formed and a first insulating layer is formed over a surface of the semiconductor substrate. A layer of nanoclusters is formed over a surface of the first insulating layer. A second insulating layer is formed over the layer of nanoclusters. Germanium is implanted into the nanoclusters. A selected portion of the second insulating layer is etched. The layer of nanoclusters is removed using a wet etch process that is selective to the first insulating layer. In another form implanting Germanium is performed using an ion energy of between 2 and 15 kilo electron Volts with a dose in the range of $10^{15}$ to $5 \times 10^{16}$ atoms/cm$^2$. In yet another form the semiconductor substrate is annealed after implanting Germanium into the nanoclusters. In yet another form a selected portion of the second insulating layer is etched by using a dry etch process. In one form the wet etch process used to remove the layer of nanoclusters is an RCA clean. In yet another form a control electrode is formed over the second insulating layer prior to etching a selected portion and source/drain extensions are implanted in the semiconductor substrate.

In yet another form there is provided a method in which a semiconductor substrate is provided. A first insulating layer is formed over a surface of the semiconductor substrate. A layer of nanoclusters is formed over a surface of the first insulating layer. A second insulating layer is formed over the layer of nanoclusters. Nitrogen is implanted into the nanoclusters. A selected portion of the second insulating layer is etched. The layer of nanoclusters is removed using a wet etch process that is selective to the first insulating layer. In one form nitrogen is implanted using an ion energy of between 1 and 6 kilo electron volts with a dose in the range of $5 \times 10^{15}$ to $5 \times 10^{16}$ atoms/cm$^2$. In another form etching the selected portion of the second insulating layer is performed by using a dry etch process. In one form the wet etch process used to remove the layer of nanoclusters is a phosphoric acid etch process. In another form a control electrode is formed over the second insulating layer prior to etching a selected portion. Source/drain extensions are implanted in the semiconductor substrate.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "plurality", as used herein, is defined as two or more than two. The term "another", as used herein, is defined as at least a second or more. The terms "including" and/or "having", as used herein, are defined as "comprising" (i.e., open language).

What is claimed is:

1. A method of removing nanoclusters in a semiconductor device comprising:
   providing a semiconductor substrate;
   forming a first insulating layer over a surface of the semiconductor substrate;
   forming a layer of nanoclusters over a surface of the first insulating layer;
   forming a second insulating layer over the layer of nanoclusters;
   etching a selected portion of the second insulating layer;
   flowing a reducing gas over the semiconductor device, the semiconductor substrate being at a temperature in a range of 400–900 degrees Celsius; and
   flowing a gas comprising halogen over the semiconductor device, the semiconductor substrate being at a temperature in a range of 400–900 degrees Celsius.

2. The method of claim 1, wherein etching a selected portion of the second insulating layer further comprises etching the selected portion using a dry etch process.

3. The method of claim 1, wherein flowing the reducing gas further comprises flowing a gas comprising hydrogen.

4. The method of claim 1, wherein flowing a gas comprising halogen further comprises flowing a gas comprising hydrogen chloride.

5. The method of claim 1, wherein the nanoclusters of the layer of nanoclusters comprises silicon.

6. The method of claim 1, further comprising forming a control electrode over the second insulating layer prior to etching a selected portion.

7. The method of claim 1, further comprising implanting source/drain extensions in the semiconductor substrate.

8. The method of claim 1, wherein forming the first insulating layer comprises forming the first insulating layer from an oxide comprising silicon.

9. The method of claim 1, wherein flowing the gas comprising halogen directly follows flowing the reducing gas without exposing the nanoclusters to oxygen.

10. A method comprising:
    providing a semiconductor substrate;
    forming a first insulating layer over a surface of the semiconductor substrate;
    forming a layer of nanoclusters over a surface of the first insulating layer;
    forming a second insulating layer over the layer of nanoclusters;
    implanting nitrogen into nanoclusters of the layer of nanoclusters;
    etching a selected portion of the second insulating layer; and
    removing the layer of nanoclusters using a wet etch process that is selective to the first insulating layer.

11. The method of claim 10, wherein implanting nitrogen comprises implanting nitrogen using an ion energy of between 1 and 6 kilo electron volts with a dose in a range of $5 \times 10^{15}$ to $5 \times 10^{16}$ atoms/cm$^2$.

12. The method of claim 10, wherein etching a selected portion of the second insulating layer further comprises using a dry etch process.

13. The method of claim 10, wherein the wet etch process comprises a phosphoric acid etch process.

14. The method of claim 10, further comprising:
    forming a control electrode over the second insulating layer prior to etching a selected portion; and
    implanting source/drain extensions in the semiconductor substrate.

* * * * *